US009848498B2

(12) United States Patent
Amirkiai et al.

(10) Patent No.: US 9,848,498 B2
(45) Date of Patent: Dec. 19, 2017

(54) OPTOELECTRONIC SUBASSEMBLY WITH COMPONENTS MOUNTED ON TOP AND BOTTOM OF SUBSTRATE

(71) Applicant: FINISAR CORPORATION, Sunnyvale, CA (US)

(72) Inventors: Maziar Amirkiai, Sunnyvale, CA (US); Yunpeng Song, Fremont, CA (US); Peter Henry Mahowald, Sunnyvale, CA (US); Hongyu Deng, Saratoga, CA (US)

(73) Assignee: FINISAR CORPORATION, Sunnyvale, CA (US)

( * ) Notice: Subject to any disclaimer, the term of this patent is extended or adjusted under 35 U.S.C. 154(b) by 38 days.

(21) Appl. No.: 14/923,037

(22) Filed: Oct. 26, 2015

(65) Prior Publication Data
US 2016/0050775 A1 Feb. 18, 2016

Related U.S. Application Data

(63) Continuation of application No. 14/824,883, filed on Aug. 12, 2015.
(Continued)

(51) Int. Cl.
*H05K 3/32* (2006.01)
*H05K 1/18* (2006.01)
(Continued)

(52) U.S. Cl.
CPC ............. *H05K 3/32* (2013.01); *G02B 6/00* (2013.01); *H05K 1/181* (2013.01); *H05K 1/0243* (2013.01);
(Continued)

(58) Field of Classification Search
CPC ......... H05K 1/0243; H05K 221/10545; H05K 1/0298; H05K 1/181; H05K 3/32;
(Continued)

(56) References Cited

U.S. PATENT DOCUMENTS 5,325,265 A * 6/1994 Turlik ................. H01L 23/3736
257/714
5,644,327 A * 7/1997 Onyskevych ............ G09G 3/30
313/503
(Continued)

FOREIGN PATENT DOCUMENTS

JP 2007271882 A 10/2007
WO 9111025 7/1991

OTHER PUBLICATIONS

International Search Report and Written Opinion for PCT Application No. PCT/US2015/057880 dated Feb. 26, 2016.
(Continued)

*Primary Examiner* — Akm Enayet Ullah
(74) *Attorney, Agent, or Firm* — Maschoff Brennan

(57) ABSTRACT

This disclosure generally relates to high-speed fiber optic networks that use light signals to transmit data over a network. The disclosed subject matter includes devices and methods relating to header subassemblies and/or optoelectronic subassemblies. In some aspects, the disclosed devices and methods may relate to a header subassembly that can include: a substrate with a substrate top and a substrate bottom; at least one optoelectronic transducer on the substrate top; at least one top electrical component on the substrate top, the electrical component can be operably coupled with the optoelectronic transducer; and at least one bottom electrical component on the substrate bottom, the bottom electrical component can be operably coupled with the optoelectronic transducer.

14 Claims, 9 Drawing Sheets

Related U.S. Application Data

(60) Provisional application No. 62/036,714, filed on Aug. 13, 2014, provisional application No. 62/039,758, filed on Aug. 20, 2014, provisional application No. 62/063,225, filed on Oct. 13, 2014, provisional application No. 62/069,707, filed on Oct. 28, 2014, provisional application No. 62/069,710, filed on Oct. 28, 2014, provisional application No. 62/069,712, filed on Oct. 28, 2014.

(51) Int. Cl.
  *G02B 6/00* (2006.01)
  *H05K 1/02* (2006.01)
  *H05K 1/11* (2006.01)

(52) U.S. Cl.
  CPC ............ *H05K 1/0298* (2013.01); *H05K 1/111* (2013.01); *H05K 2201/10121* (2013.01); *H05K 2201/10545* (2013.01); *Y02P 70/611* (2015.11)

(58) Field of Classification Search
  CPC .......... H05K 2201/10121; H05K 1/111; G02B 6/00; Y02P 70/611
  USPC .............................................. 385/14, 16, 24
  See application file for complete search history.

(56) References Cited

U.S. PATENT DOCUMENTS

| | | |
|---|---|---|
| 6,343,164 B1 | 1/2002 | Robertsson et al. |
| 6,795,461 B1 | 9/2004 | Blair et al. |
| 8,378,475 B1 | 2/2013 | Veitch et al. |
| 2001/0024551 A1 | 9/2001 | Yonemura et al. |
| 2001/0051026 A1 | 12/2001 | Steinberg et al. |
| 2004/0061232 A1* | 4/2004 | Shah ................... H01L 21/4857 257/758 |
| 2004/0163836 A1* | 8/2004 | Kumar ................ H01S 5/02212 174/50 |
| 2004/0264884 A1 | 12/2004 | Liu |
| 2005/0244095 A1 | 11/2005 | Ellison |
| 2013/0279139 A1 | 10/2013 | Deng et al. |
| 2014/0205246 A1 | 7/2014 | Li et al. |

OTHER PUBLICATIONS

International Search Report and Written Opinion, as issued in connection with International Patent Application No. PCT/US2015/057881, dated Feb. 12, 2016, 12 pgs.

International Search Report and Written Opinion for PCT Application No. PCT/US2015/057883 dated Dec. 23, 2015.

* cited by examiner

OPTOELECTRONIC SUBASSEMBLY WITH COMPONENTS MOUNTED ON TOP AND BOTTOM OF SUBSTRATE

CROSS-REFERENCE TO RELATED APPLICATIONS

This application is a continuation of patent application Ser. No. 14/824,883, filed Aug. 12, 2015, entitled FERRULE ASSEMBLIES, which claims priority to U.S. Provisional Application 62/036,714, filed Aug. 13, 2014, entitled FERRULE ASSEMBLIES, U.S. Provisional Application 62/039,758, filed Aug. 20, 2014, entitled LENS RECEPTACLES, U.S. Provisional Application 62/063,225, filed Oct. 13, 2014, entitled MULTI-LENS OPTICAL COMPONENTS, U.S. Provisional Application 62/069,707 filed Oct. 28, 2014, entitled MULTI-CHANNEL OPTOELECTRONIC SUBASSEMBLIES, U.S. Provisional Application 62/069,710 filed Oct. 28, 2014, entitled MULTI-LAYER SUBSTRATES, and U.S. Provisional Application 62/069,712 filed Oct. 28, 2014, entitled SUBSTRATES INCLUDING OPTOELECTRONIC COMPONENTS; which are all incorporated by reference herein in their entirety.

BACKGROUND

The present disclosure relates to high-speed fiber optic networks that use light signals to transmit data over a network. Fiber optic networks have various advantages over other types of networks such as copper wire based networks. Many existing copper wire networks operate at near maximum possible data transmission rates and at near maximum possible distances for copper wire technology. Fiber optic networks are able to reliably transmit data at higher rates over further distances than is possible with copper wire networks.

The claimed subject matter is not limited to configurations that solve any disadvantages or that operate only in environments such as those described above. This background is only provided to illustrate examples of where the present disclosure may be utilized.

SUMMARY

In one example, a header subassembly includes: a substrate with a substrate top and a substrate bottom; at least one optoelectronic transducer on the substrate top; at least one top electrical component on the substrate top, the electrical component operably coupled with the optoelectronic transducer; and at least one bottom electrical component on the substrate bottom, the bottom electrical component operably coupled with the optoelectronic transducer.

In another example, an optoelectronic subassembly includes: a header subassembly including a substrate with a substrate top and a substrate bottom, at least one optoelectronic transducer on the substrate top, at least one top electrical component on the substrate top (the top electrical component operably coupled with the optoelectronic transducer), and at least one bottom electrical component on the substrate bottom (the bottom electrical component operably coupled with the optoelectronic transducer); and a housing coupled to the header subassembly and defining a cavity at least partially enclosing the optoelectronic transducer and the top electrical component.

In yet another example, a method includes: providing a substrate with a substrate top and a substrate bottom; positioning at least one optoelectronic transducer on the substrate top; providing a plurality of electrical components including at least one top electrical component and at least one bottom electrical component; positioning the top electrical component on the substrate top; and positioning the bottom electrical component on the substrate bottom.

This Summary is provided to introduce a selection of concepts in a simplified form that are further described below. This Summary is not intended to identify key features or essential characteristics and is not intended to be used as an aid in determining the scope of the claims. Additional features and advantages will be set forth in the description which follows, and in part will be obvious from the description, or may be learned by practice.

DETAILED DESCRIPTION

Figure 1A:
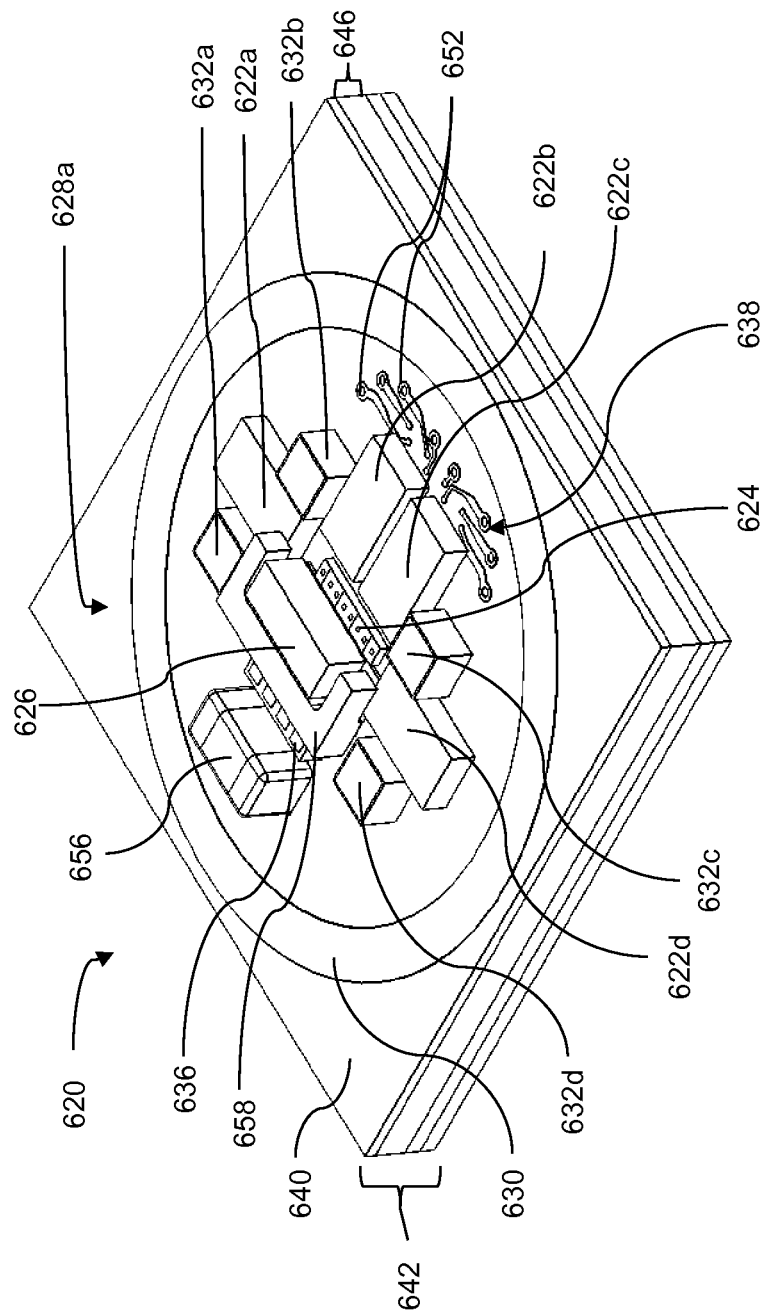
FIG. 1A is a top perspective view of an embodiment of a header subassembly.

Reference will be made to the drawings and specific language will be used to describe various aspects of the disclosure. Using the drawings and description in this manner should not be construed as limiting its scope. Additional aspects may become obvious in light of the disclosure, including the claims, or may be learned by practice.

The terms and words used in the following description and claims are not limited to the bibliographical meanings, but are merely used to enable a clear and consistent understanding of the disclosure. It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those skilled in the art, may occur in amounts that do not preclude the effect the characteristic was intended to provide.

The term "optoelectronic subassembly" may be used to refer to any portion of an optoelectronic assembly. However, at times this disclosure may use "optoelectronic subassembly" to refer to specific portions of an optoelectronic assembly, as may be indicated by context.

High-speed fiber optic networks use light signals (which may also be referred to as optical signals) to transmit data over a network. Fiber optic networks have various advantages over other types of networks such as copper wire based networks. Many existing copper wire networks operate at near maximum possible data transmission rates and at near maximum possible distances for copper wire technology. Fiber optic networks are able to reliably transmit data at higher rates over further distances than is possible with copper wire networks.

Although fiber optic networks use light signals to carry data, many electronic devices such as computers and other network devices use electrical signals. Accordingly, optoelectronic assemblies may be used to convert electrical signals to optical signals, convert optical signals to electrical signals, or convert both electrical signals to optical signals and optical signals to electrical signals.

Optoelectronic assemblies may include optoelectronic subassemblies ("OSAs"), such as receiver optoelectronic subassemblies ("ROSAs"), transmitter optoelectronic subassemblies ("TOSAs"), or both. A ROSA receives light signals with a light detector such as a photodiode and converts light signals into electrical signals. A TOSA receives electrical signals and transmits corresponding light signals. A TOSA may include an optical transmitter such as a laser that generates light that is transmitted to a fiber optic network. Optoelectronic assemblies or subassemblies may include various components such as optical components and/or electronic components.

Optoelectronic assemblies or subassemblies may include various components such as optical components and/or electronic components. Optical components involve optical signals and may, for example, emit, receive, transmit, carry, focus, and/or collimate optical signals. Electrical components involve electrical signals may, for example, receive, transmit, carry, transduce, transform, modulate, and/or amplify electronic signals. Optoelectronic components may involve both electrical and optical signals, and may be referred to as transducer components. Optoelectronic components may change optical signals to electrical signals and/or change electrical signals to optical signals (e.g., diodes or lasers).

Some optoelectronic assemblies may include multiple channels ("multi-channel optoelectronic assemblies"), with each channel corresponding to a set of one or more optical signals travelling through an optical fiber. Multi-channel optoelectronic assemblies may support increased data transfer rates through fiber optic networks. For example, a four channel optoelectronic assembly may be able to send and receive data at data transfer rates of approximately four times the data transfer rate of a comparable single channel optoelectronic assembly.

Ferrule assemblies may be used in fiber optic networks to physically and/or optically couple optical fibers with optoelectronic assemblies, optoelectronic subassemblies, optical components and/or electronic components. For example, ferrule assemblies may be used to couple ROSAs and/or TOSAs to optical fibers that are part of a fiber optic network thereby permitting the ROSA to receive optical signals and/or permitting the TOSA to transmit optical signals. Additionally or alternatively, ferrule assemblies may form part of an optoelectronic assembly or subassembly configured to transmit or receive electrical or optical signals in a fiber optic network.

Some optoelectronic assemblies may include hermetically sealed housings to protect components. However, space within hermetically sealed housings may be limited, especially if the optoelectronic assemblies comply with small form factor industry standards. Furthermore, increasing the size of hermetically sealed housings may increase the costs of producing optoelectronic assemblies. Conversely, decreasing the size of hermetically sealed housings may decrease the costs of producing optoelectronic assemblies.

Producing some hermetically sealing structures may increase the production costs of optoelectronic assemblies. In some circumstances, producing hermetically sealing structures with greater hermetically sealed portions may be more expensive than producing hermetically sealing structures with smaller hermetically sealed portions. Some hermetic sealing structures may add to the complexity of optoelectronic assemblies. Additionally or alternatively, some hermetic sealing structures may increase the size of optoelectronic assemblies.

Optoelectronic assemblies may need to comply with certain standards that may specify aspects of optoelectronic assemblies such as size, power handling, component interfaces, operating wavelengths or other specifications. Examples of such standards include CFP, XAUI, QSFP, QSFP+, XFP, SFP and GBIC. Complying with such standards may limit the structure, size, cost, performance or other aspects of optoelectronic assembly designs. Such standards may also limit configurations of components of optoelectronic assemblies such as receptacles that receive ferrule assemblies and/or hermetic sealing structures such as housings.

In some optoelectronic assemblies, electronic and/or radio frequency signal transmission lines ("RF lines") may couple lasers or other components of optoelectronic assemblies. The electrical performance of the RF lines ("RF performance" or "RF response") may be important to the operation optoelectronic assemblies. Accurately controlling and/or reducing the dimensions of RF lines may contribute to optoelectronic assemblies with suitable and/or favorable RF performance. However, the design and positioning of components of optoelectronic assemblies may prevent the length RF lines from being sufficiently controlled and/or minimized. The electrical performance of the RF lines may be particularly important for relatively high frequency optoelectronic assemblies, such as those that operate at 1, 2, 4, 10, 30 gigabits per second (Gb/s) or higher.

Components such as optoelectronic subassemblies or portions of optoelectronic subassemblies may be produced in large quantities and the produced components may need to comply with specifications that specify various aspects of the produced components (e.g. shape, dimensions and/or positioning). The produced components may include variations in the specifications. Some variation in specifications may be permitted because the produced components may be suitable or work properly. Some variations in specifications may result in components that are unsuitable. Tolerance may refer to an allowable amount of variation of a specification (e.g. dimension or positioning). Some specifications may have higher ("wider") or lower ("tighter") tolerance. For example, outside dimensions of optoelectronic subassemblies may have a wider tolerance because the variations may not affect the operation of the produced optoelectronic subassemblies. In another example, the positioning of optical components may require a tighter tolerance because the positioning affects the focus and/or transmission of optical signals. In yet another example, the dimensions of RF lines may require tighter tolerances because the dimensions may significantly affect RF performance.

The selected production processes may affect the prevalence and extent of the variations. In some circumstances the production processes may be controlled to increase or decrease the range of variation, the frequency of the variations, or other aspects. In some circumstances, producing components to tighter tolerances may increase production costs (or vice versa). For example, the tighter tolerance production processes may be more expensive than wider tolerance production processes. Tighter tolerance may result in more unsuitable components. Unsuitable components may be discarded without recovering production costs or repaired adding to production costs. Production processes may be modified to decrease or eliminate the production of unsuitable components, but in some circumstances this may increase costs.

FIGS. 1A-1F illustrate an example header subassembly 620. The header subassembly 620 may include a substrate 642 and optoelectronic components coupled to or formed on the substrate 642. The optoelectronic components may include any suitable components that may be used in optoelectronic subassemblies such as TOSAs, ROSAs and/or other optoelectronic subassemblies. More specifically, the optoelectronic components may include electrical components 628a,b (e.g. integrated circuits, drivers, amplifiers, capacitors, control circuits, and/or others), optical components 626 (e.g. lenses, prisms, mirrors, filters, and/or others) and/or one or more optoelectronic transducers 624 (e.g. optical transmitters, optical receivers, photodiodes, phototransistors, photoresistors, photomultipliers, integrated optical circuit elements, imaging devices, laser diodes, lasers, light-emitting diodes, and/or others).

As illustrated, in some configurations the optoelectronic components may be positioned on both a substrate top 640 and a substrate bottom 648. The optical components 626 and/or the optoelectronic transducer 624 may be positioned on the substrate top 640 and the electrical components 628a,b may be positioned on either one or both of the substrate top 640 and the substrate bottom 648. For example, as illustrated in FIGS. 1E and 1F, electrical components 628a may be positioned on the substrate top 640 and electrical components 628b may be positioned on the substrate bottom 648. In such configurations, any of the electrical components 628a connected with RF lines and/or requiring hermetic sealing may be positioned on the substrate top 640 and any of the electrical components 628b not connected with RF lines and/or requiring hermetic sealing may be positioned on the substrate bottom 648. These and other aspects will be discussed in further detail below.

The optoelectronic transducer 624 may be configured to convert a signal in one form of energy to another form of energy. For example, the optoelectronic transducer 624 may be configured to convert electrical signals to optical signals and/or convert optical signals to electrical signals, or both. The optoelectronic transducer 624 may include optical transmitters, optical receivers, photodiodes, phototransistors, photoresistors, photomultipliers, integrated optical circuit elements, imaging devices, laser diodes, lasers, light-emitting diodes, and/or other suitable components. The optoelectronic transducer 624 may be positioned on the top layer 640 to permit the optical signals to be transmitted and/or received by the optoelectronic transducer 624. In some configurations, the optoelectronic transducer 624 may be coupled by RF lines and the optoelectronic transducer 624 may be positioned on the top layer 640 to maintain RF performance (for example, by minimizing the length of the RF lines).

As illustrated, the optoelectronic transducer 624 may be capable of transmitting and/or receiving optical signals to and/or from a fiber optic network. In such configurations, the optoelectronic transducer 624 may include one or more receivers, receiver arrays, optical transmitters, optical transmitter arrays, lasers, laser arrays, monitor photodiodes ("MPD"), MPD arrays, and/or other suitable components. In some configurations, the optoelectronic transducer 624 may be a laser array and/or a receiver array.

The electrical components 628a,b may include integrated circuits, drivers, amplifiers, capacitors, control circuits, and/or other suitable components. Some or all of the electrical components 628a,b and/or the optoelectronic transducer 624, may be electrically coupled to one another. For example, the electrical components 628a,b and/or the optoelectronic transducer 624 may be coupled to one another by signal lines 638, vias 652, contact pads 644, wire bonds, or other suitable interconnections, as will be discussed in further detail below. Some of the electrical components 628a,b and/or the optoelectronic transducers 624 may be coupled to one another with RF lines.

The optoelectronic components may include one more optical components 626. The optical components 626 may include one or more of a lens, prism, mirror, filter, or other suitable component or combination thereof. The optical components 626 may be may be optically coupled to one other and permit optical signals to travel between the optical components 626.

The substrate 642 may be a multilayer substrate. Each layer of the multilayer substrate 642 may be planar and positioned parallel to one another (although other configurations are contemplated). In such configurations, the substrate top 640 may be a top layer, and the substrate bottom 648 may be a bottom layer. Intermediate layers 646 may be positioned between the top layer 640 and the bottom layer 648. As illustrated, the multilayer substrate 642 can include five total layers with three intermediate layers 646 between the top layer 640 and the bottom layer 648. However, the multilayer substrate 642 may include any suitable number of total layers or intermediate layers 646. In some circumstances, the multilayer substrate 642 may include more than one top layer 640 and/or more than one bottom layer 648. Accordingly, the bottom layer 648 may refer to multiple bottom layers 648 and the top layer 640 may refer to multiple top layers 640.

The header subassembly 620 may include a square or rectangular configuration. The header subassembly 620 may include other configurations such as circular, square with rounded or truncated corners, or any other suitable configuration. The layers of the multilayer substrate 642 (e.g. the bottom layer 648, the intermediate layers 646 and/or the top layers 640) may be formed out of any substrate material such as a ceramic material. At least a portion of the multilayer substrate 642 may be formed of a ceramic material such as alumina, aluminum oxide, aluminum nitrate or other suitable materials.

As illustrated for example in FIG. 1A, the electrical components 628a may be positioned on the top of the multilayer substrate 642 on the top layer 640. As illustrated for example in FIG. 1B, the electrical components 628b may also be positioned on the bottom of the multilayer substrate 642 on the bottom layer 648. FIGS. 1E and 1F illustrate that the electrical components 628a,b may be positioned on both the top layer 640 and the bottom layer 648 of the multilayer substrate 642. In other configurations, the electrical components 628a,b may be positioned on either the top layer 640 or the bottom layer 648.

Figure 1B:
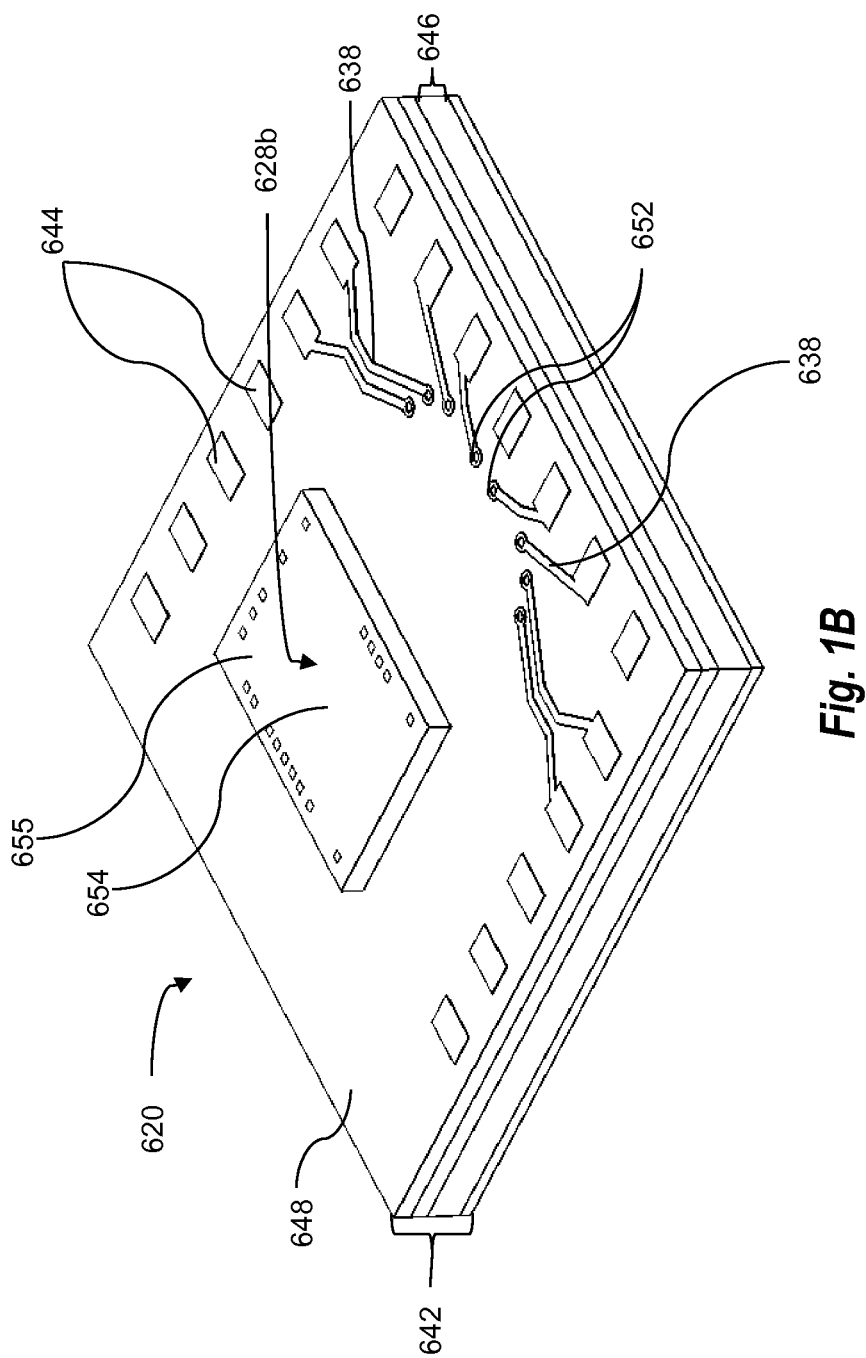
FIG. 1B is a bottom perspective view of the header subassembly of FIG. 1A.
Figure 1C:
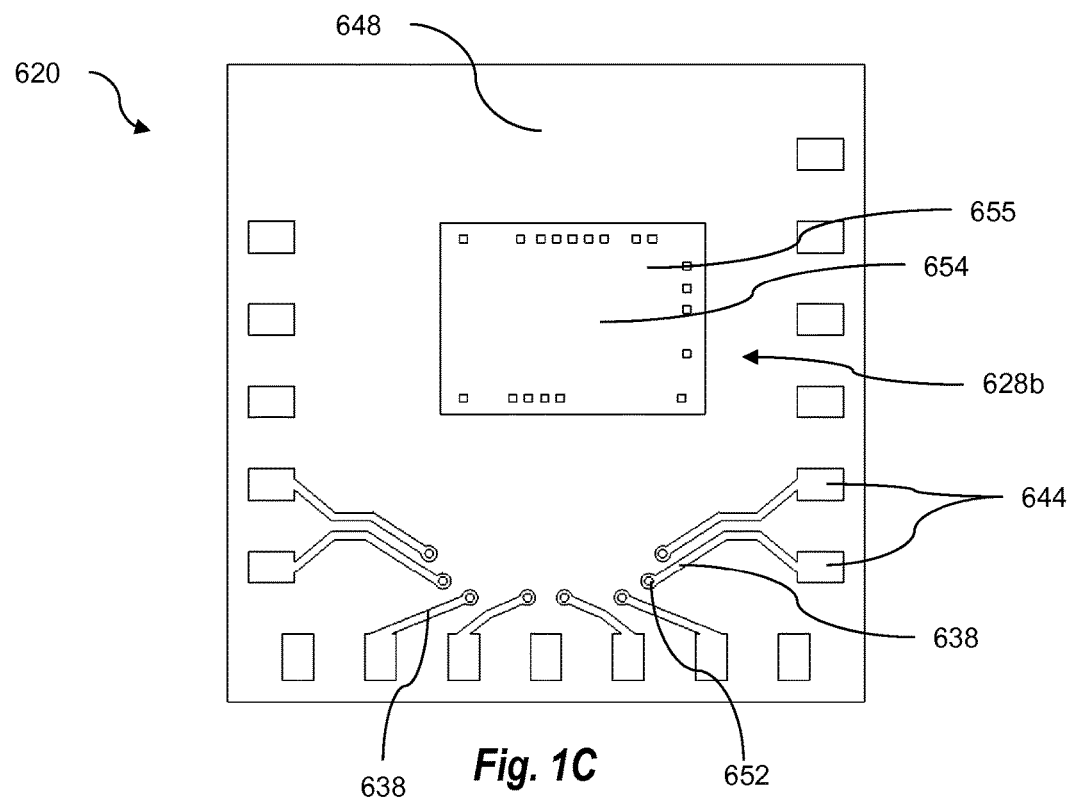
FIG. 1C is a bottom view of the header subassembly of FIG. 1A.
Figure 1D:
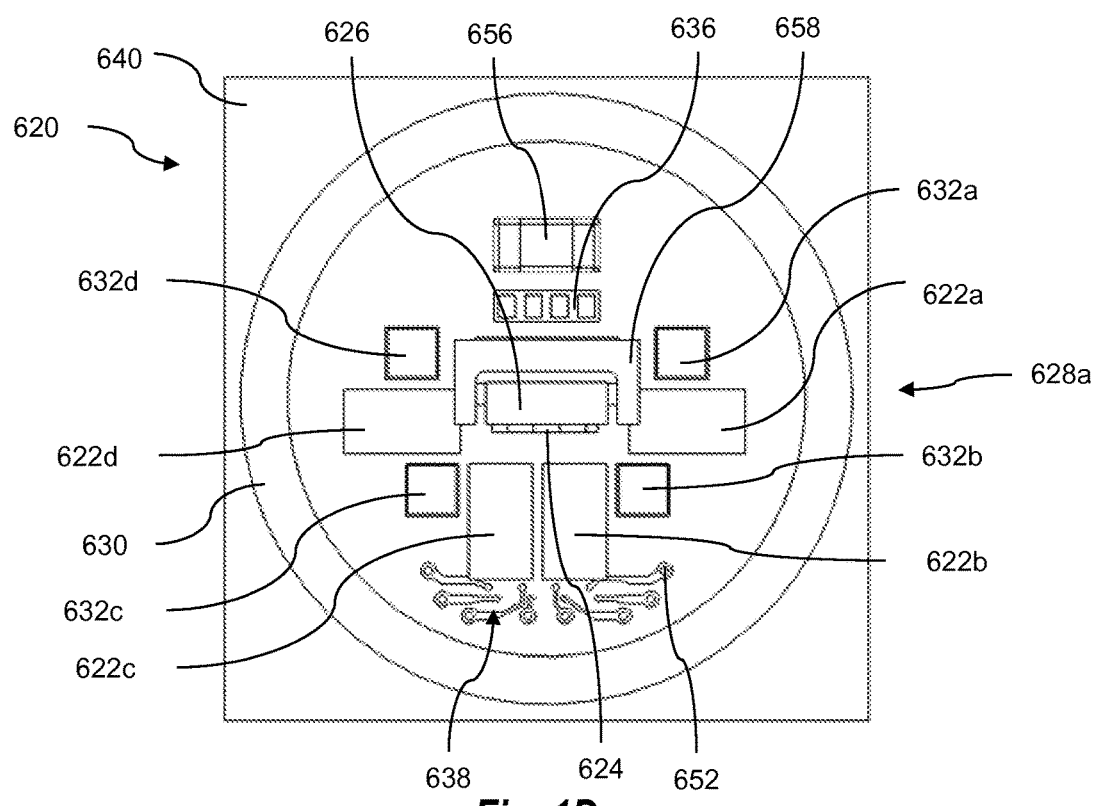
FIG. 1D is a top view of the header subassembly of FIG. 1A.
Figure 1E:
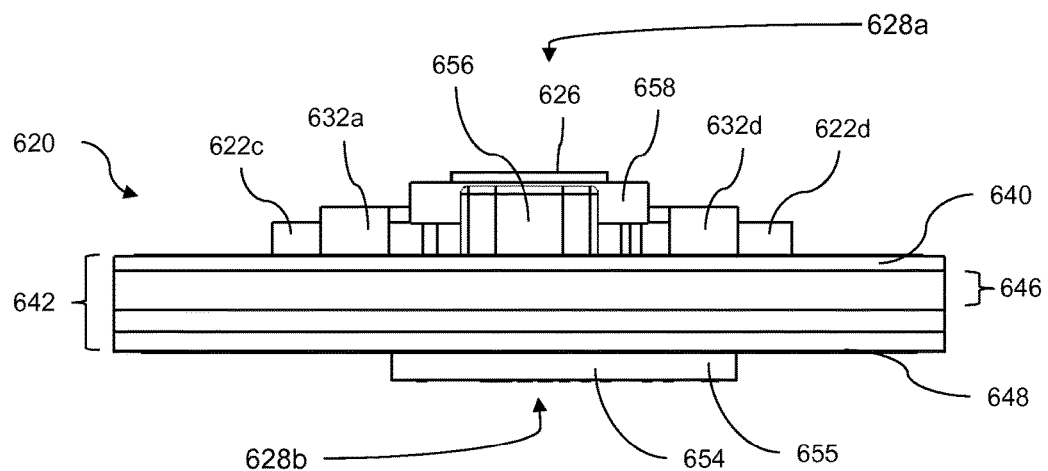
FIGS. 1E-1F are side views of the header subassembly of FIG. 1A.
Figure 1F:
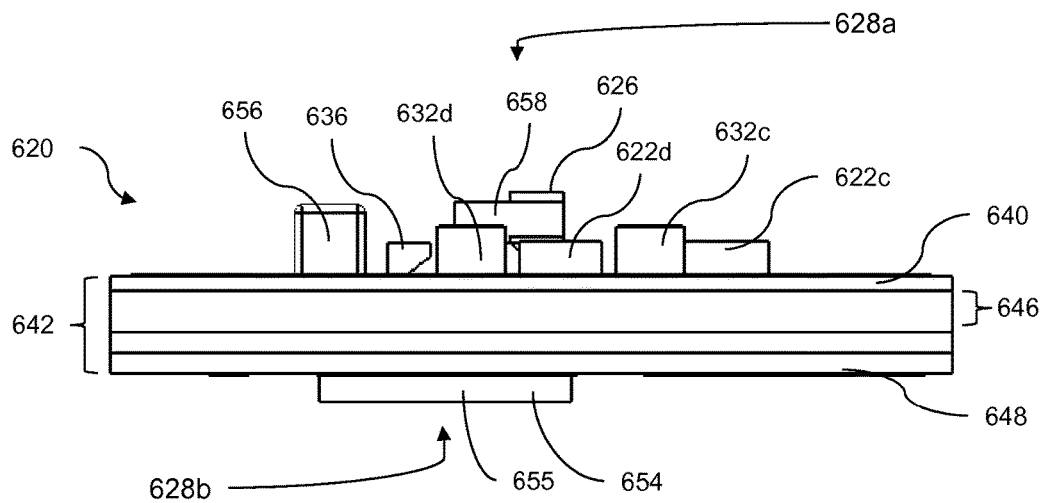

As illustrated for example in FIGS. 1B and 1C, the header subassembly 620 may include contact pads 644 positioned on the bottom layer 648 and may permit electrical power and/or control signals to be transmitted to the electrical components 628*a,b* and/or optoelectronic transducer 624. The contact pads 644 may engage flex circuits, printed circuit boards ("PCBs"), or other connectors and/or electronic assemblies. As illustrated for example in FIGS. 1C and 1D, signal lines 638 may electrically couple one or more of the electrical components 628*a,b* and/or optoelectronic transducer 624 to transmit power, data signals, and/or control signals to the electrical components 628*a,b* and/or to other components. Some of the signal lines 638 may be RF signal lines.

With continued reference to FIGS. 1A-1F, vias 652 of conductive material may extend through at least a portion of the multilayer substrate 642 (only some of the vias are illustrated and/or labeled in the Figures for clarity). Some of the vias 652 may be electrically coupled to the traces positioned between layers ("traces") of the multilayer substrate 642 the contact pads 644, the electrical components 628*a,b* and/or optoelectronic transducer 624. The vias 652 may permit power and/or control signals to travel between the traces, the contact pads 644, the electrical components 628*a,b* and/or the optoelectronic transducer 624. The vias 652 and/or the traces may be part of the signal lines 638.

In some configurations, the vias 652 may be formed with the multilayer substrate 642 or coupled to the multilayer substrate 642 after some or all of the layers are coupled to one another. For example, one or more of the layers of the multilayer substrate 642 may include conductive material that forms the vias 652 when the layers are coupled to one another. In another example, an opening may be formed through one or more of the layers of the multilayer substrate 642 and a conductive material may be positioned in the opening to form the vias 652. Although the vias 652 may be formed of any suitable conductive material, in some examples the vias 652 may be formed of a metal such as silver (Ag), gold (Au), nickel (Ni), titanium (Ti), palladium (Pd), tungsten (W), tungsten-molybdenum (WMo) or other material. The vias 652 may be formed by any suitable process.

Traces of conductive material (not illustrated) may be positioned on one or more of the intermediate layers 646 using a suitable process. Although the traces may be formed of any suitable conductive material, in some examples the traces may be formed of a metal such as silver (Ag), gold (Au), nickel (Ni), titanium (Ti), palladium (Pd), tungsten (W), tungsten-molybdenum (WMo) or other material. In some configurations, the traces may be part of the signal lines 638.

Figure 3A:
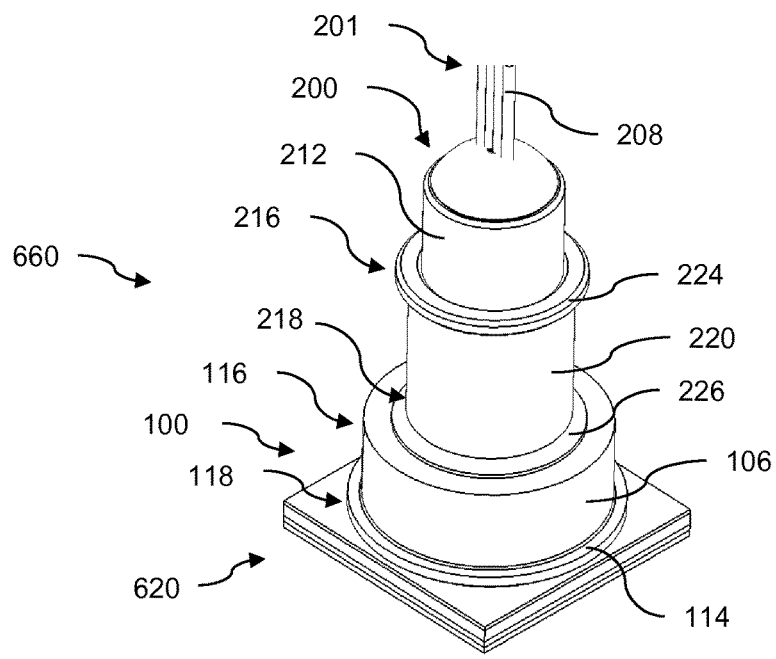
FIG. 3A is a top perspective view of an embodiment of an optoelectronic subassembly.
Figure 3B:
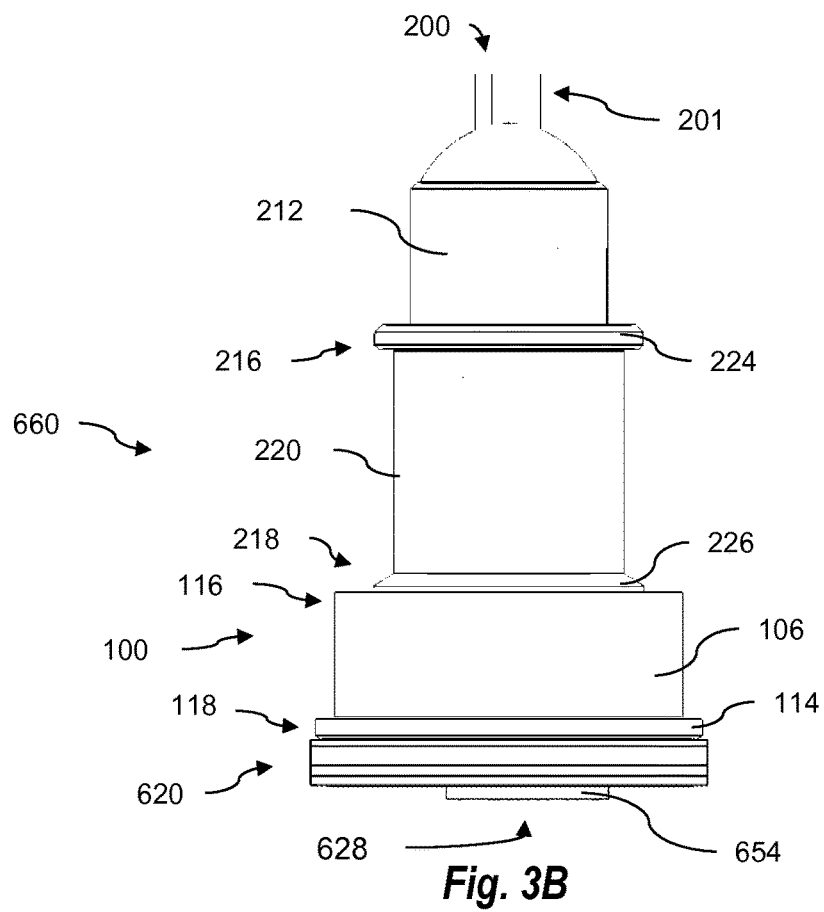
FIG. 3B is a side view of the optoelectronic subassembly of FIG. 3A.
Figure 3C:
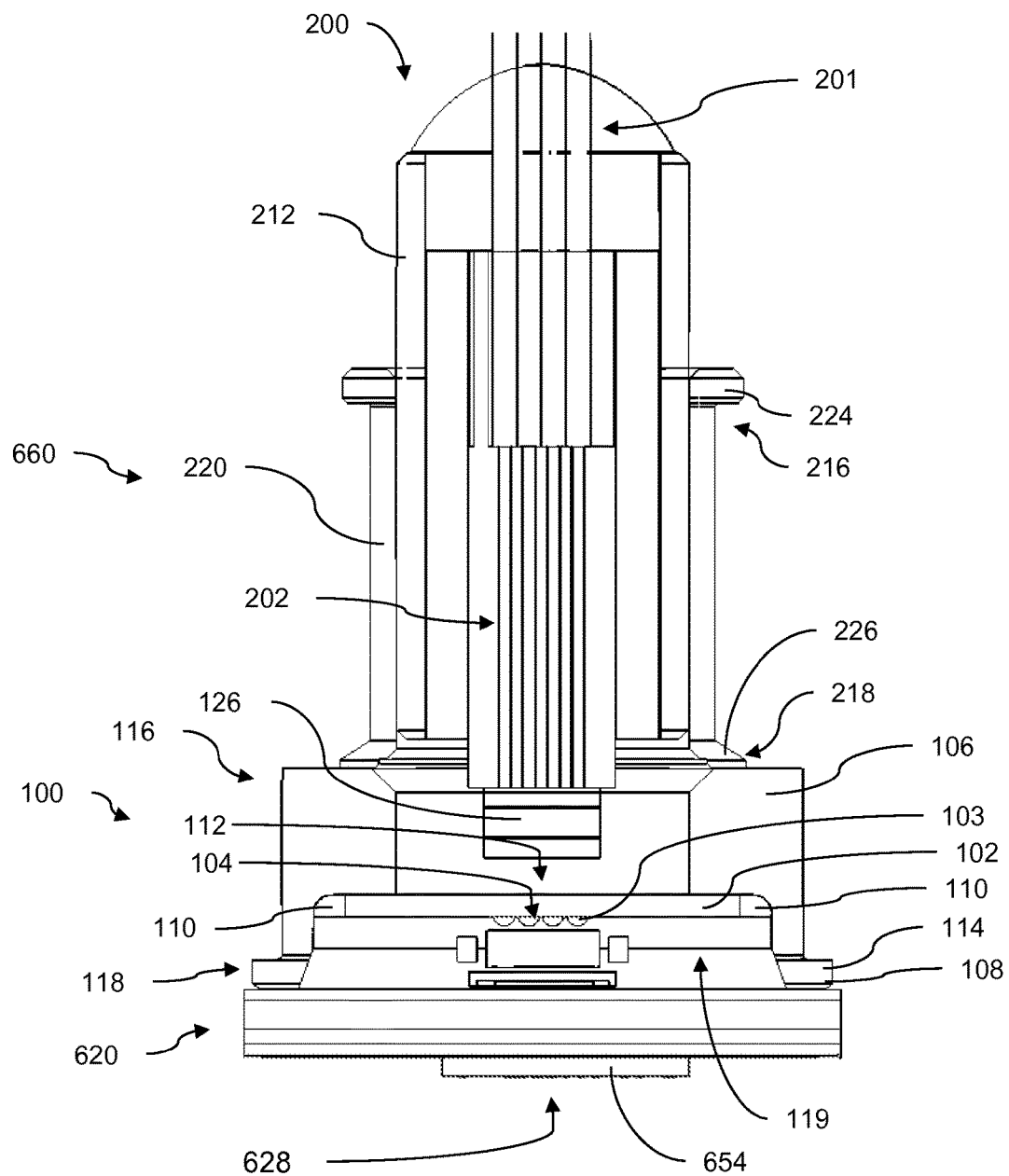
FIG. 3C is a side cross-sectional view of the optoelectronic subassembly of FIG. 3A.

The header subassembly may be part of an optoelectronic subassembly such as an optoelectronic subassembly 660 (FIGS. 3A-3C). In one example, if the optoelectronic subassembly 660 includes a TOSA, the optoelectronic components of the header subassembly 620 may include a laser or a laser array (for example if the optoelectronic subassembly 660 is a multi-channel optoelectronic subassembly). In another example, if the optoelectronic subassembly 660 includes a ROSA, the optoelectronic components may include a receiver or a receiver array (for example if the optoelectronic subassembly 660 is a multi-channel optoelectronic subassembly). In some configurations, the header subassembly 620 may include both a TOSA and a ROSA and the optoelectronic components may include suitable components for both TOSAs and ROSAs.

The electrical components 628*a,b* may include at least one laser driver, such as laser driver 622*a*. The electrical components 628*a,b* can include any suitable amount of laser drivers, and in some configurations the electrical components 628*a,b* may include four laser drivers 622*a*, 622*b*, 622*c* and 622*d*. The laser drivers 622*a-d* may be configured to receive electrical signals, modulate the electrical signals, and transmit a modulated signal to the optoelectronic transducer 624, which in this configuration may be a laser or a laser array. In some configurations, at least one of the laser drivers 622*a-d* may modulate more than one channel of signals. At least one of the laser drivers 622*a-d* may be an integrated circuit. In some configurations where the optoelectronic transducer 624 is capable of transmitting four channels of optical signals (e.g. by including four laser transmitters), each of the laser drivers 622*a-d* may modulate one corresponding channel of electrical signals. The laser drivers 622*a-d* may be positioned on either the top layer 640 or the bottom layer 648. In some configurations, the laser drivers 622*a-d* are coupled by RF lines and the laser drivers 622*a-d* are positioned on the top layer 640 to maintain RF performance (for example, by minimizing the length of the RF lines).

The electrical components 628*a,b* may include at least one electrical component 632*a* positioned on the top layer 640. Any suitable number of such electrical components may be included, and in some configurations the electrical components 628*a,b* may include four electrical components 632*a*, 632*b*, 632*c* and 632*d*. At least one of the electrical components 632*a-d* may be a noise reducing capacitor configured to protect at least one of the electrical components 628*a,b* from effects such as noise ("noise effects") or transients ("transient effects"). Noise caused by other circuit elements (which may be electrical components 628*a,b* or elements not part of the header subassembly 620) may be shunted through a decoupling capacitor, reducing the effect the other circuit elements have on at least one of the electrical components 628*a,b*. In some configurations, at least one of the electrical components 632*a-d* may be electrically coupled between a power supply and a ground of the header subassembly 620. The electrical components 632*a-d* may be electrically coupled by one or more of the signal lines 638, vias 652 and/or traces within the multilayer substrate 642. In some circumstances, at least one of the electrical components 632*a-d* may be configured as a bypass capacitor to bypass high impedance components of the header subassembly 620. If the header subassembly 620 is configured to transmit four channels of optical signals, the electrical components 632*a-d* may each be capable of reducing noise or transient effects for one channel of signals. In some configurations, at least one of the electrical components 632*a-d* may modulate and/or reduce noise or transient effects for more than one channel of signals.

The optoelectronic components may include a second optoelectronic transducer 636 such as a receiver array 636. The receiver array 636 may be configured to receive multiple channels of optical signals, in some configurations four channels of optical signals. The receiver array 636 may one or more receivers such as photodiodes configured to receive optical signals and transmit corresponding electrical signals to the electrical components. As illustrated, the receiver array 636 may be a monitor photodiode array configured to monitor output from the optoelectronic transducer 624, for example by receiving a portion of the optical signals transmitted by the optoelectronic transducer 624. In such configurations, electrical signals from the monitor photodiode array may be transmitted to control circuitry which may be part of the electrical components 628*a,b*. In other configurations, the receiver array 636 may be part of a ROSA and configured to receive optical signals travelling from a fiber optic network. Additionally or alternatively, any suitable aspects described with respect to the optoelectronic transducer 624 may apply to the second optoelectronic transducer such as the receiver array 636.

The electrical components 628a,b may include electrical component 656 positioned on the top layer 640. The electrical component 656 may be any suitable electrical component such as integrated circuits, capacitors, inductors, resistors, control circuitry, diodes, ferrite beads, attenuators and modulation circuitry. In non-illustrated configurations, the electrical components 628a,b may include more than one electrical component 656. In some configurations, the electrical component 656 may be hermetically sealed by a housing or optical component such as optical component 100 (FIG. 3B). In some configurations, the electrical component 656 may require a hermetic seal or sealing structure. In other configurations, the electrical component 656 may be a component that requires no hermetic seal.

The electrical components 628b may include an electrical component 654 positioned on the bottom layer 648 and/or on the bottom of the multilayer substrate 642. The electrical component 654 may any suitable component including components that may be positioned top of the multilayer substrate 642. For example, the electrical component 654 may include integrated circuits, capacitors, inductors, resistors, control circuitry, diodes, ferrite beads, attenuators and modulation circuitry. In some configurations, the electrical component 654 may be a controller that manages aspects of the header subassembly 620 circuitry. For example, the controller may send and receive control signals to the other electrical components 628b or optoelectronic transducer 624. Additionally or alternatively, the controller may modulate signals received through the contact pads 644. The electrical component 654 may be electrically coupled to other electrical components 628b by signals lines 638 and/or vias 652. In some configurations, the electrical component 654 may not be coupled by RF lines. In such configurations, the positioning of the electrical component 654 may not decrease RF performance of the header subassembly 620. As such, the electrical component 654 may be positioned further from the top layer 640 and/or other electrical components 628a,b without affecting RF performance. For example, the electrical component 654 may be a capacitor, resistor and/or attenuator.

In some configurations, the electrical component 654 may not be hermetically sealed by a housing or optical component such as optical component 100 (FIG. 3A-3C). In some configurations, the electrical component 654 may have its own hermetic seal or hermetic sealing structure. As illustrated, the electrical component 654 may be an integrated circuit with a hermetically sealing package 655 surrounding at least a portion of the integrated circuit. In another example, the electrical component 654 may be dipped in coating material such as epoxy or resin that forms a hermetic seal around at least a portion of the electrical component 654 when it settles. Components such as integrated circuits, drivers and/or attenuators may include their own hermetic seal. The electrical component 654 may be a component that requires no hermetic seal. For example, components such as resistors, capacitors, ferrite beads and/or flex cables may not require a hermetic seal.

The optoelectronic components may include a component coupling 658. The component coupling 658 may mechanically and/or electrically couple any of the optoelectronic components to the header subassembly 620. In some configurations, the component coupling 658 may mechanically couple the optical component 626 to the header subassembly 620. In such configurations, the component coupling 658 may retain the optical component 626 optically aligned and/or coupled with the optoelectronic transducer 624 and/or the receiver array 636. In some configurations, the component coupling 658 may be a lens holder. The component coupling 658 may facilitate optical alignment or adjustment of optical alignment of the optical component 626.

Although as illustrated, the optoelectronic components appear discrete, the optoelectronic components (such as the electrical components 628a,b, the optoelectronic transducer 624, the optical components 626 and/or other components) may not be discrete components. The optoelectronic components may be built in to the multilayer substrate 642 between various layers, and/or printed between the layers of the multilayer substrate 642. The layers of the multilayer substrate 642 may contribute to capacitive properties and/or function as power and ground planes, and/or may have a dielectric in between them, thereby permitting operation as a parallel plate capacitor.

Additionally or alternatively, the header subassembly 620 may include any suitable aspects of U.S. Provisional Application 62/069,710 filed Oct. 28, 2014, entitled MULTI-LAYER SUBSTRATES and/or U.S. Provisional Application 62/069,712 filed Oct. 28, 2014, entitled SUBSTRATES INCLUDING OPTOELECTRONIC COMPONENTS, which are both hereby incorporated by reference in their entirety. Aspects of forming multilayer substrates such as the multilayer substrate 642 are described in further detail in "Multi-layer Substrates."

Figure 2:
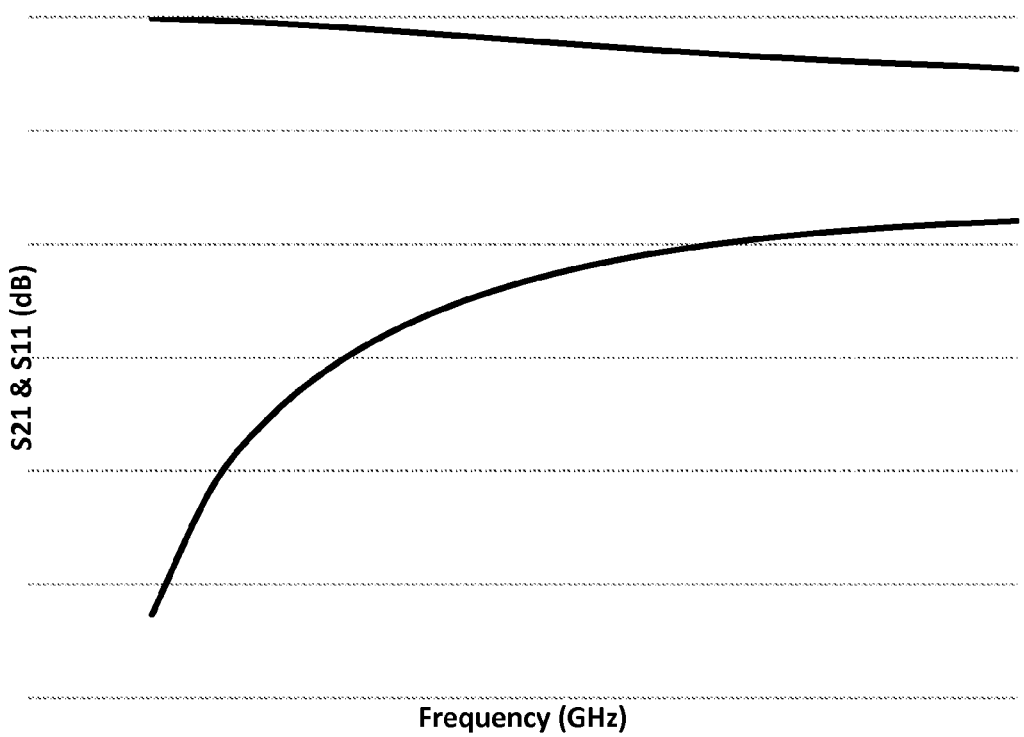
FIG. 2 is a graph indicating RF performance data for an embodiment of a header subassembly.

FIG. 2 illustrates RF performance data for a header subassembly such as the header subassembly 620 including the electrical component 654 positioned on the bottom of the header subassembly 620. As illustrated, the header subassembly 620 may exhibit favorable RF performance characteristics. In some configurations, the electrical component 654 may be a component not coupled by RF lines. In other configurations, the electrical component 654 may be coupled by RF lines. In such configurations, the dimensions, positioning and structure of the RF lines may be precisely controlled to maintain desirable RF performance.

As illustrated for example in FIGS. 3A-3C, the header subassembly 620 may be part of the optoelectronic subassembly 660. The optoelectronic subassembly 660 may include an optical component 600 and a ferrule assembly 200. The optoelectronic subassembly 660 may include: a TOSA configured to convert electrical signals to optical signals; a ROSA configured to convert optical signals to electrical signals; or a TOSA and a ROSA to convert both electrical signals to optical signals and optical signals to electrical signals. In some configurations, the optical component 100 may hermetically seal portions of the header subassembly 620.

As illustrated, the optoelectronic subassembly 660 may be configured to be part of a multi-channel optoelectronic assembly. Aspects of the header subassembly 620 facilitating positioning and/or spacing of the optoelectronic components configured to send and/or receive multiple sets of optical signals, each set of optical signals corresponding to one channel of a multi-channel optoelectronic subassembly. In some configurations, the optoelectronic subassembly 660 may be a four channel optoelectronic subassembly configured to send and/or receive four channels of data. In such configurations, the optoelectronic subassembly 660 may comply with the QSFP standard.

Aspects of the header subassembly 620 may facilitate production of compact optoelectronic subassemblies incorporating the header subassembly 620. Additionally or alternatively, aspects may permit optoelectronic components of larger size or greater quantities to be included in the optoelectronic subassembly 660 because the electrical components 628a,b may be positioned on either side of the multilayer substrate 642.

Aspects of the header subassembly 620 may facilitate maintaining the integrity of the data signals transmitted through the signal lines 638 which may include maintaining signal impedance within acceptable levels. In one aspect, the impedance may be managed by minimizing the length of RF lines such as the signal lines 638, vias 652 and/or traces between layers of the multilayer substrate 642. The length of the signal lines 638, vias 652 and/or traces can be selected based on the electrical and RF conditions that are to be experienced in the optoelectronic subassembly 660. For example, computer simulations of various designs of the signal lines 638, vias 652 and/or traces can be performed to identify those that generate acceptable RF performance or RF responses.

Aspects of the optoelectronic subassembly 660 may contribute to decreased production costs. For example, some aspects of the optoelectronic subassembly 660 may simplify the production processes and/or may decrease the costs of the materials used to produce the optoelectronic subassembly 660. Some aspects of the optoelectronic subassembly 660 may facilitate cost-effective production of the optoelectronic subassembly 660 with desirable RF performance.

As illustrated in FIGS. 3A-3C, the optical component 100 may be configured to interface with the header subassembly 620 and/or the ferrule assembly 200. The optoelectronic subassembly 660 and or the optical component 100 may include any suitable aspects of U.S. Provisional Application 62/063,225, filed Oct. 13, 2014, entitled MULTI-LENS OPTICAL COMPONENTS, and U.S. patent application Ser. No. 14/881,693, filed Oct. 13, 2015, entitled MULTI-LENS OPTICAL COMPONENTS, which are hereby incorporated by reference in their entirety. Additionally or alternatively, the optoelectronic subassembly 660 may include any suitable aspects of U.S. Provisional Application 62/039,758, filed Aug. 20, 2014, entitled LENS RECEPTACLES, and U.S. patent application Ser. No. 14/831,499, filed Aug. 20, 2015, entitled LENS RECEPTACLES which are hereby incorporated by reference in their entirety.

The optical component 100 can include a housing 106 extending between a housing top 116 and a housing bottom 118. The housing top 116 and the housing bottom 118 generally refer to portions of the optical component 100 and are not limited to portions at or near the ends of the optical component 100. The optical component 100 may include a window 102 with a lens array 104 of lenses 103 (only one of which is labeled in the Figures for clarity). The lens array 104 may be configured to convey, direct and/or focus optical signals travelling between optoelectronic components such as the header subassembly 620 and/or ferrule assemblies. Each lens 103 may be configured to convey, direct and/or focus optical signals corresponding to one channel of a multi-channel header subassembly such as the header subassembly 620. The optical component 100 may include a window seal 110 that contributes to providing a hermetic seal between the housing 106 and the window 102. The housing 106, the window 102 and/or the window seal 110 may define a cavity 119. In some configurations, the cavity 119 may hermetically seal portions of the header subassembly 620 when coupled to header subassembly 620 and thus may be referred to as a hermetically sealed cavity 119.

The optical component 100 may include an aperture 112 defined by the housing 106 and/or the window 102. The aperture 112 may be configured (e.g. shaped and/or dimensioned) to permit optical signals to travel through at least a portion of the optical component 100 to the window 102. In some configurations, the aperture 112 may receive or house at least a portion of additional optical components within the aperture 112. For example, as illustrated in FIG. 3C, the aperture 112 may receive an optical component 126 that may be an isolator or other components that relate to optical signals.

The window 102 may be optically transmissive and may be integral to the housing 106 or coupled to the housing 106. The lens array 104 may be positioned on the window 102, at or near the housing bottom 118 and/or within the cavity 119. The lenses 103 of the optical component 100 may be optically transmissive convex surfaces configured to convey, direct and/or focus optical signals. The lenses 103 may be coupled to or integral with the window 102. All or some of the lenses 103 may be configured (e.g. shaped, dimensioned and/or positioned) to convey, direct and/or focus optical signals corresponding to one channel of a multi-channel subassembly, such as header subassembly 620.

The housing bottom 118 may include a housing flange 114 with a flange base 108 configured (shaped and/or dimensioned) to interface with the header subassembly 620. The flange base 108 may be configured to be coupled to a housing seat 630 (FIG. 1A) of the header subassembly 620. For example, the housing flange 114 and/or the flange base 108 may include annular configurations corresponding to annular configurations of the housing seat 630, or vice versa. In another example, the housing seat 630 can be any position where the flange base 108 interfaces with the header subassembly 620.

The housing top 116 may be configured (shaped and/or dimensioned) to interface with the ferrule assembly 200, or vice versa. In one example, the housing 106 may be circular or annular, although the housing 106 may be any suitable configurations including rectangular, oval, multifaceted and other configurations. The ferrule assembly 200 may include circular configurations or other configurations corresponding to the housing 106.

The window seal 110 may be annular and positioned between the window 102 and the housing 106. In other configurations, the window seal 110 may not be annular. For example, in configurations where the housing 106 is rectangular, the window seal 110 may also include a corresponding rectangular configuration. In addition to or instead of contributing to providing a hermetic seal, the window seal 110 may contribute to coupling the window 102 to the housing 106. For example, for configurations where a hermetic seal is not desired or required, the window seal 110 may couple the window 102 to the housing 106 and may not contribute to providing a hermetic seal. In other configurations, the window seal 110 may both contribute in coupling the window 102 to the housing 106 as well as contribute to providing a hermetic seal.

The window 102 may be formed partially or entirely of an optically transmissive material. For example, the window 102 may be formed partially or entirely of glass, plastic polymer, or other suitable materials. Any of the lenses 103 may be formed partially or entirely of an optically transmissive material such as glass, plastic polymer silicon, silicon compounds or other suitable materials. The lenses 103 may be integrally formed with the window 102 or coupled to the window 102 during or after its production.

In some configurations, the optical component 100 may be configured to hermetically seal portions of the header subassembly 620 and/or optoelectronic components of the header subassembly 620. The housing bottom 118 may be configured (e.g. shaped and/or dimensioned) to interface with the header subassembly 620. The housing flange 114 and/or the flange base 108 may be configured (e.g. shaped, dimensioned and/or positioned) to be coupled to the housing seat 630 of the header subassembly 620. The optical component 100 may be coupled to the header subassembly 620 by welding, soldering, glass soldering, adhesives, fasteners, fusing or any other suitable technique. The coupling between the optical component 100 and the header subassembly 620 may contribute to hermetically sealing portions of the header subassembly 620 and/or optoelectronic components of the header subassembly 620.

The optical component 100 (e.g. the window 102) may be configured to permit optical signals to travel between the ferrule assembly 200 and the header subassembly 620 (e.g. the optoelectronic transducer 624) when the optical component 100 is positioned there between. For example, in some configurations optical signals may travel from the optoelectronic transducer 624, through the lens array 104 and the window 102 of the optical component, through the aperture 112, and to the optical fibers 202. In another example, in some configurations optical signals may travel from the optical fibers 202, through the aperture 112, the window 102 and the lens array 104 of the optical component 100, then to the optoelectronic transducer 624 (FIG. 1A) of the header subassembly 620.

As illustrated for example in FIG. 3C, the lens array 104 may be positioned on one side of the window 102 and within the cavity 119. In other configurations the lens array 104 and the lenses 103 may be positioned on the other side of the window 102 in a position corresponding to the aperture 112, such as on the light receiving side of the window 102 for a ROSA or light transmitting side of the window 102 for a TOSA. In another configuration, the lens array 104 and the lenses 103 may be positioned on both sides of the window 102. In such configurations, corresponding pairs of lenses 103 may both contribute to focusing and/or transmitting optical signals for one channel of a multi-channel optoelectronic subassembly. The lens array 104 may include any suitable configuration of lenses 103. For example, the lens array 104 may include a linear configuration as illustrated in FIG. 3C. In other configurations the lens array 104 may include a square or rectangular configuration. In yet other configurations the lens array 104 may include a circular or annular configuration. The lens array 104 may include any suitable number of lenses. For example, FIG. 3C illustrates the lens array 104 with four lenses 103.

The ferrule assembly 200 may include multiple optical fibers 202, with each optical fiber 202 configured to convey optical signals corresponding to at least one channel The ferrule assembly 200 may include any suitable aspects of patent application Ser. No. 14/824,883, filed Aug. 12, 2015, entitled FERRULE ASSEMBLIES, and Provisional Application 62/036,714, filed Aug. 13, 2014, entitled FERRULE ASSEMBLIES, which are both hereby incorporated by reference in their entirety. Aspects of "Ferrule Assemblies" may be incorporated in the ferrule assemblies described in this application and/or the configurations of optoelectronic subassemblies.

The ferrule assembly 200 can include upper and lower clamp members configured to retain optical fibers 202 of corresponding optical cables 201 (which may be a single optical cable or a plurality of optical cables, such as ribbon optical cables) positioned between the clamp members. A ferrule body 212 may surround at least a portion of the upper and lower clamp members and/or the optical fibers 202. The ferrule body 212 can be configured to hold the upper and lower clamp members together to clamp the optical fibers 202 between the upper and lower clamp members.

The optical cables 201 can include casings 208 surrounding at least a portion of the optical fibers 202. The casing 208 can be configured to insulate and/or guard the optical fibers 202. As illustrated, at least one or all of the optical fibers 202 can include a corresponding one of the casings 208. Additionally or alternatively, one of the casings 208 can surround more than one of the optical fibers 202 and/or can surround all of the optical fibers 202. A portion of the optical fibers 202 may be exposed from the casing 208.

As illustrated, the ferrule assembly 200 can be configured to retain the optical fibers 202 in a linear configuration where at least a portion of the optical fibers 202 share a common plane. The configuration of the optical fibers 202 of the ferrule assembly 200 may correspond to the configuration of the optical component 100 and/or the header subassembly 620. For example, the linear configurations of the optical fibers 202 may correspond to the linear configuration of the lens array 104 and/or the optoelectronic components of the header subassembly 620. Additionally or alternatively, the optical fibers 202 may be arranged in any suitable configuration such as square, rectangular, circular or any this configuration may correspond to alternative configurations of the optical component 100 and/or the header subassembly 620.

The ferrule assembly 200 may include an alignment sleeve 220 with a cylindrical body extending between a sleeve top 216 and a sleeve bottom 218 and defining a sleeve cavity. The sleeve cavity may include a configuration (e.g., shape and/or dimension) corresponding to the ferrule body 212 to receive the ferrule body 212. The alignment sleeve 220 may include an upper sleeve flange 224 positioned on the sleeve top 216 and/or a lower sleeve flange 226 positioned on the sleeve bottom 218. The sleeve bottom 218 of the alignment sleeve 220 may be configured (e.g. shaped and/or dimensioned) to interface with the optical component 100. As illustrated for example in FIG. 3C, the sleeve bottom 218 may interface with the housing top 116 at the lower sleeve flange 226.

When the optical component 100 is coupled to the header subassembly 620 at the housing seat 630, the optoelectronic components positioned within the housing seat 630 may be hermetically sealed by the optical component 100. In non-illustrated configurations, optoelectronic components of the header subassembly 620 may be positioned on the top side of the header subassembly 620 outside of the annular housing seat 630. In such configurations, when the optical component 100 is coupled to the header subassembly 620 at the housing seat 630, the optoelectronic components positioned outside of the housing seat 630 may not be hermetically sealed by the optical component 100. Optoelectronic components of the header subassembly 620 positioned on the bottom side of the header subassembly 620 may not be hermetically sealed by the optical component and/or may not be hermetically sealed at all.

The positioning of any or all of the electrical components 628a,b may be selected based on hermetic sealing characteristics. In one example, the positioning of the electrical components 628a on the top side and/or the electrical components 628b on the bottom side of the header subassembly 620 may be selected based on hermetic sealing requirements of the electrical components 628a-b and/or other considerations such as production costs, spacing requirements, and other design characteristics of the optoelectronic subassembly 660. Additionally or alternatively, the positioning of the electrical components 628a outside or within the housing seat 630 may be selected based on hermetic sealing requirements of the electrical components 628a,b and/or other considerations such as production costs, spacing requirements, and other design characteristics of the optoelectronic subassembly 660.

The positioning of any or all of the electrical components 628a,b may be selected based RF performance characteristics. Electrical components 628a requiring RF performance may be positioned on the top side of the header subassembly 620 close to the other electrical components 628a. For example, electrical components 628a coupled by RF lines may be positioned on the top side of the header subassembly 620 close to the other electrical components 628a. Electrical components 628b not requiring RF performance may be positioned on the bottom side of the header subassembly 620 or on the top side of the header subassembly 620 further from the other electrical components 628b. For example, electrical components 628b not coupled by RF lines may be positioned on the bottom side of the header subassembly 620 or on the top side further from the other electrical components 628a for example outside of the housing seat 630

In some configurations, electrical components 628a coupled with RF lines and/or requiring hermetic sealing may be positioned within the housing seat 630 on the top side of the header subassembly 620. In such configurations, electrical components 628b not coupled with RF lines and not requiring hermetic sealing by the optical component 100 may be positioned on the bottom side of the header subassembly 620 and/or outside of the housing seat 630.

Figure 4A:
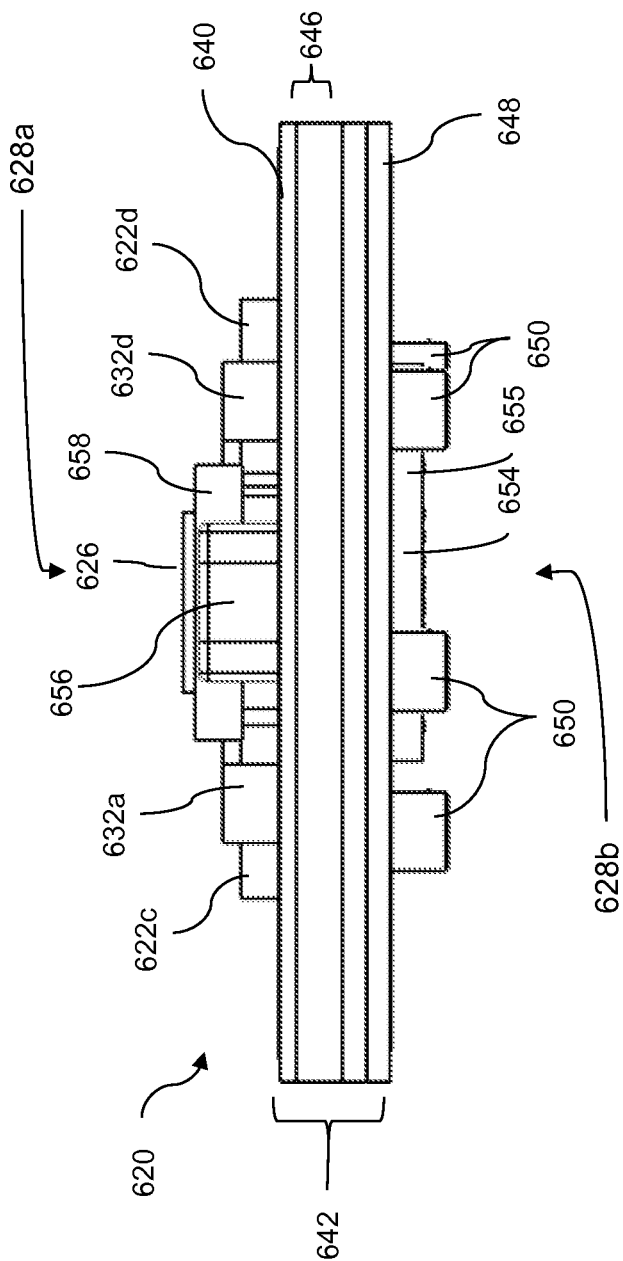
FIG. 4A is a side view of an embodiment of a header subassembly.
Figure 4B:
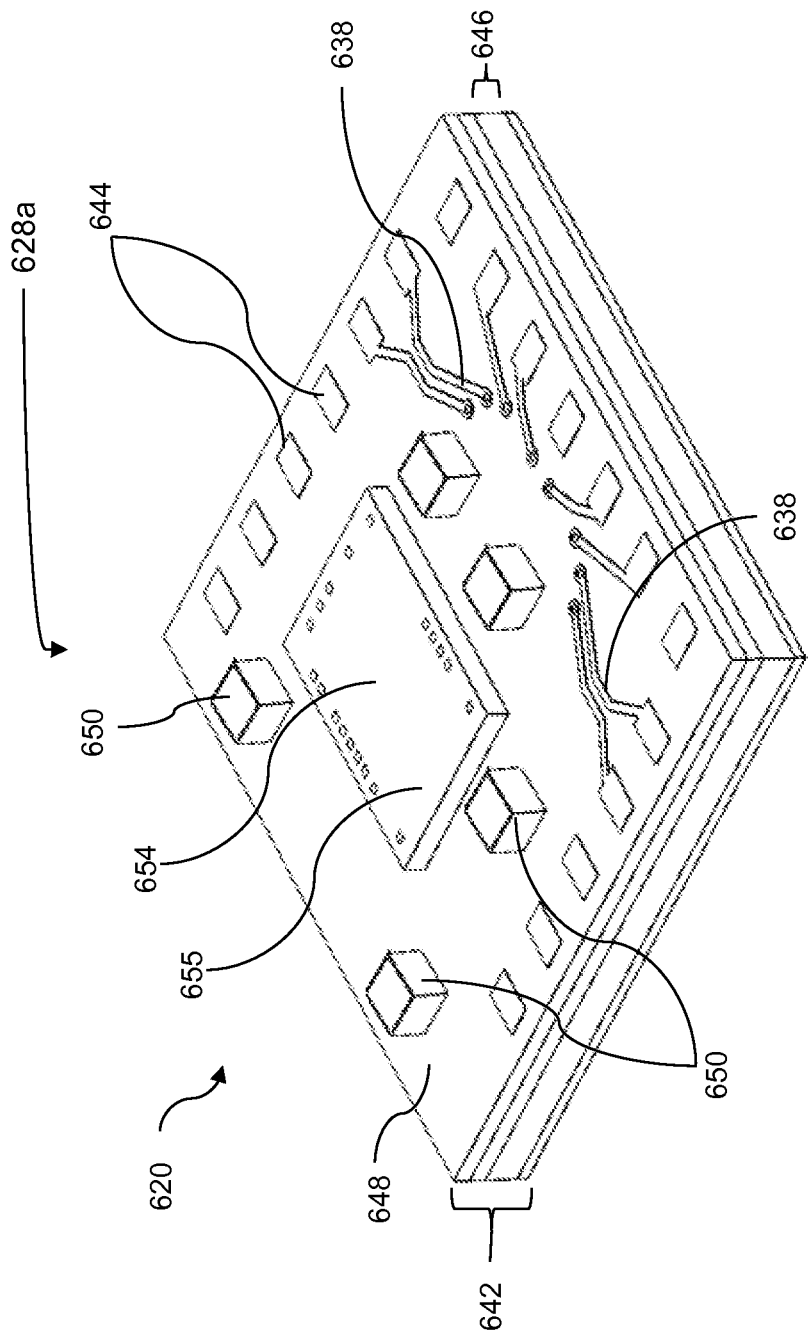
FIG. 4B is a perspective view of an embodiment of a header subassembly.

Turning to FIGS. 4A-4B, any suitable number of additional components 650 may be positioned on the bottom side of the header subassembly 620. As illustrated, in some configurations the additional components 650 may be positioned on the bottom side of the header subassembly 620 in addition to electrical component 654. Additional components 650 may be part of the electrical components 628a,b and may include any suitable aspects described in connection with the electrical components 628a,b. For example, the additional component 650 may include integrated circuits, capacitors, inductors, resistors, control circuitry, diodes, ferrite beads, attenuators, flex cables and/or modulation circuitry. In some configurations, the additional components 650 do not require hermetic sealing and/or are not coupled by RF lines. In other configurations, the additional components 650 do not include optical components.

In some configurations, a header subassembly can include: a substrate with a substrate top and a substrate bottom; at least one optoelectronic transducer on the substrate top; at least one top electrical component on the substrate top, the electrical component can be operably coupled with the optoelectronic transducer; and at least one bottom electrical component on the substrate bottom, the bottom electrical component can be operably coupled with the optoelectronic transducer.

In some configurations of the header subassembly, the bottom electrical component can be operably coupled with the optoelectronic transducer via the top electrical component. In some configurations of the header subassembly, the bottom electrical component can be electrically coupled with the top electrical component. In some configurations of the header subassembly, the bottom electrical component can be electrically coupled with the optoelectronic transducer. In some configurations of the header subassembly, the optoelectronic transducer can be coupled to RF lines. In some configurations of the header subassembly, the top electrical component can be coupled to RF lines.

In some configurations, the header subassembly can include a housing coupled to the substrate top and hermetically sealing the top electrical component and the optoelectronic transducer between the housing and the substrate top. In some configurations, the header subassembly can include at least one optical component on the substrate top. In some configurations, the header subassembly can include at least one second optical component on the substrate top and optically coupled with the optical component.

In some configurations of the header subassembly, the substrate can be a multilayer substrate. In some configurations of the header subassembly, the substrate top can be a top layer, and the substrate bottom can be a bottom layer, and intermediate layers can be positioned between the top layer and the bottom layer.

In some configurations, the header subassembly can include contact pads positioned on the substrate bottom, the contact pads can permit electrical power and/or control signals to be transmitted to the optoelectronic transducer. In some configurations, the header subassembly can include signal lines electrically coupling the optoelectronic transducer, at least one of the signal lines can be electrically coupled with at least one of the contact pads. In some configurations, the header subassembly can include vias extending through at least a portion of the substrate. In some configurations of the header subassembly, at least one of the vias can be electrically coupled with at least one of the contact pads. In some configurations of the header subassembly, at least one of the vias can be electrically coupled with at least one of the signal lines.

In some configurations of the header subassembly, the top electrical component can have optimal operation when hermetically sealed. In some configurations of the header subassembly, the bottom electrical component can include a hermetic sealing structure. In some configurations of the header subassembly, the bottom electrical component can have optimal operation without being hermetically sealed. In some configurations of the header subassembly, the bottom electrical component may not be coupled with RF lines. In some configurations of the header subassembly, the bottom electrical component may not be coupled by RF lines and can have optimal operation without being hermetically sealed.

In some configurations of the header subassembly, the optoelectronic transducer, the top electrical component, or the bottom electrical component can be located at least partially in the substrate. In some configurations of the header subassembly, the optoelectronic transducer can include one or more of: a laser, a laser array, a receiver, and a receiver array. In some configurations of the header subassembly, the optoelectronic transducer can include one or more of: an optical transmitter, an optical receiver, a photodiode, a phototransistor, a photoresistor, a photomultiplier, an integrated optical circuit element, an imaging device, a laser diode, and a light-emitting diode. In some configurations of the header subassembly, the top electrical component or the bottom electrical component can be a laser driver capable of receiving electrical signals, modulating the electrical signals, and transmitting a modulated signal. In some configurations of the header subassembly, the top electrical component and/or the bottom electrical component can include one or more of: a resistor, a ferrite bead, a diode, an attenuator, an integrated circuit, a driver, an amplifier, a capacitor, a control circuit, and a noise reducing capacitor capable of reducing noise effects. In some configurations of the header subassembly, the optical component can include one or more of: a lens, a prism, a mirror and a filter.

In some configurations, an optoelectronic subassembly can include a header subassembly including a substrate with a substrate top and a substrate bottom, at least one optoelectronic transducer on the substrate top, at least one top electrical component on the substrate top (the top electrical component operably coupled with the optoelectronic transducer), and at least one bottom electrical component on the substrate bottom (the bottom electrical component operably coupled with the optoelectronic transducer); and a housing coupled to the header subassembly and defining a cavity at least partially enclosing the optoelectronic transducer and the top electrical component.

In some configurations of the optoelectronic subassembly, the housing can hermetically seal the optoelectronic transducer and the top electrical component. In some configurations of the optoelectronic subassembly, the bottom electrical component may not hermetically seal by the housing. In some configurations of the optoelectronic subassembly, the bottom electrical component can be operably coupled with the optoelectronic transducer via the top electrical component. In some configurations of the optoelectronic subassembly, the bottom electrical component can be electrically coupled with the top electrical component. In some configurations of the optoelectronic subassembly, the bottom electrical component can be electrically coupled with the optoelectronic transducer. In some configurations of the optoelectronic subassembly, the optoelectronic transducer can be coupled to RF lines. In some configurations of the optoelectronic subassembly, the top electrical component can be coupled to RF lines.

In some configurations, the optoelectronic subassembly can include at least one optical component on the substrate top. In some configurations, the optoelectronic subassembly can include at least one second optical component on the substrate top and optically coupled with the optical component.

In some configurations of the optoelectronic subassembly, the substrate is a multilayer substrate. In some configurations of the optoelectronic subassembly, the substrate top can be a top layer, and the substrate bottom can be a bottom layer, and intermediate layers can be positioned between the top layer and the bottom layer.

In some configurations, the optoelectronic subassembly can include contact pads positioned on the substrate bottom, the contact pads may permit electrical power and/or control signals to be transmitted to the optoelectronic transducer. In some configurations, the optoelectronic subassembly can include signal lines electrically coupling the optoelectronic transducer, at least one of the signal lines electrically coupled with at least one of the contact pads. In some configurations, the optoelectronic subassembly can include vias extending through at least a portion of the substrate. In some configurations of the optoelectronic subassembly, at least one of the vias may be electrically coupled with at least one of the contact pads. In some configurations of the optoelectronic subassembly, at least one of the vias may be electrically coupled with at least one of the signal lines.

In some configurations of the optoelectronic subassembly, the top electrical component can have optimal operation when hermetically sealed. In some configurations of the optoelectronic subassembly, the bottom electrical component can include a hermetic sealing structure. In some configurations of the optoelectronic subassembly, the bottom electrical component can have optimal operation without being hermetically sealed. In some configurations of the optoelectronic subassembly, the bottom electrical component may not be coupled with RF lines. In some configurations of the optoelectronic subassembly, the bottom electrical component is not coupled by RF lines and has optimal operation without being hermetically sealed.

In some configurations of the optoelectronic subassembly, the optoelectronic transducer, the top electrical component, or the bottom electrical component can be located at least partially in the substrate. In some configurations of the optoelectronic subassembly, the optoelectronic transducer can include one or more of: a laser, a laser array, a receiver, a receiver array, an optical transmitter, an optical receiver, a photodiode, a phototransistor, a photoresistor, a photomultiplier, an integrated optical circuit element, an imaging device, a laser diode, and a light-emitting diode. In some configurations of the optoelectronic subassembly, the top electrical component or the bottom electrical component can be a laser driver capable of receiving electrical signals, modulating the electrical signals, and transmitting a modulated signal. In some configurations of the optoelectronic subassembly, the top electrical component or the bottom electrical component can include one or more of: a resistor, a ferrite bead, a diode, an attenuator, an integrated circuit, a driver, an amplifier, a capacitor, a control circuit and a noise reducing capacitor capable of reducing noise effects. In some configurations of the optoelectronic subassembly, the optical component can include one or more of: a lens, a prism, a mirror and a filter.

In some aspects, a method can include providing a substrate with a substrate top and a substrate bottom; positioning at least one optoelectronic transducer on the substrate top; providing a plurality of electrical components including at least one top electrical component and at least one bottom electrical component; positioning the top electrical component on the substrate top; and positioning the bottom electrical component on the substrate bottom.

In some aspects, the method can include determining which of the plurality of electrical components is the top electrical component or the bottom electrical component. In some aspects, the method can include determining which of the plurality of electrical components is to be coupled by RF lines. In some aspects, the method can include determining that the plurality of electrical components to be coupled by RF lines is the top electrical component and coupling the top electrical component with the substrate top. In some aspects, the method can include determining which of the plurality of electrical components have optimal operation when hermetically sealed. In some aspects, the method can include determining that the plurality of electrical components having optimal operation when hermetically sealed is the top electrical component and coupling the top electrical component with the substrate top. In some aspects, the method can include coupling a housing to the substrate top, and the housing may hermetically seal the top electrical component and the optoelectronic transducer between the housing and the substrate top. In some aspects, the method can include determining that the plurality of electrical components not having optimal operation when hermetically sealed and not to be coupled by the RF lines is the bottom electrical component and coupling the bottom electrical component with the substrate bottom.

In some aspects of the method, the substrate can be a multilayer substrate. In some aspects of the method, the substrate top can be a top layer, and the substrate bottom can be a bottom layer, and intermediate layers can be positioned between the top layer and the bottom layer.

In some aspects, the method can include electrically coupling the plurality of electrical components with one another. In some aspects, the method can include forming signal lines on the substrate and the signal lines can be capable of electrically coupling one or more of: the optoelectronic transducer, the top electrical component, and the bottom electrical component. In some aspects, the method can include forming contact pads on the substrate bottom, the contact pads can be capable of permitting electrical power and/or control signals to be transmitted to the plurality of electrical components. In some aspects, the method can include electrically coupling at least one of the signal lines with at least one of the contact pads. In some aspects, the method can include forming vias extending through at least a portion of the substrate. In some aspects, the method can include electrically coupling at least one of the vias with one or more of: the signal lines and the contact pads.

In some aspects, the method can include positioning at least one optical component on the substrate top. In some aspects, the method can include positioning at least one second optical component on the substrate top and optically coupling the second optical component with the optical component. In some aspects of the method, the optical component can include one or more of: a lens, a prism, a mirror and a filter. In some aspects of the method, the second optical component can include one or more of: a lens, a prism, a mirror and a filter.

In some aspects of the method, the optoelectronic transducer can include one or more of: a laser, a laser array, a receiver, a receiver array, an optical transmitter, an optical receiver, a photodiode, a phototransistor, a photoresistor, a photomultiplier, an integrated optical circuit element, an imaging device, a laser diode, and a light-emitting diode. In some aspects of the method, the top electrical component or the bottom electrical component can include one or more of: an integrated circuit, a driver, an amplifier, a capacitor, a control circuit, and a noise reducing capacitor capable of reducing noise effects.

The present disclosure may be embodied in other specific forms without departing from its spirit or essential characteristics. The described configurations are in all respects illustrative and not restrictive. The claimed subject matter is indicated by the appended claims rather than by the foregoing description. All changes that come within the meaning and range of equivalency of the claims are to be embraced within their scope.

What is claimed is:

1. A header subassembly comprising:
   a substrate with a substrate top and a substrate bottom;
   an optoelectronic transducer on the substrate top;
   at least one top electrical component on the substrate top, the top electrical component operably coupled with the optoelectronic transducer;
   a housing coupled to the substrate top and hermetically sealing the top electrical component and the optoelectronic transducer between the housing and the substrate top and
   a controller coupled to the substrate bottom and located outside of the housing, the controller operably coupled with the optoelectronic transducer and configured to send and receive control signals to the at least one top electrical component and optoelectronic transducer.

2. The header subassembly of claim 1, wherein the controller is electrically coupled with the top electrical component and the optoelectronic transducer.

3. The header subassembly of claim 1, wherein the controller is not coupled by RF lines.

4. The header subassembly of claim 1, wherein the controller is operable without being hermetically sealed.

5. The header subassembly of claim 1, wherein the substrate is a multilayer substrate, the substrate top is a top layer, and the substrate bottom is a bottom layer, and intermediate layers are positioned between the top layer and the bottom layer.

6. The header subassembly of claim 1, further comprising contact pads positioned on the substrate bottom, and signal lines electrically coupling the optoelectronic transducer to the contact pads to permit electrical power and/or control signals to be transmitted to the optoelectronic transducer.

7. The header subassembly of claim 1, wherein the controller includes a hermetic sealing structure.

8. The header subassembly of claim 1, wherein the optoelectronic transducer includes one or more of: an optical transmitter, a laser, a laser array, an optical receiver, and a receiver array.

9. An optoelectronic sub assembly comprising:
   a header subassembly comprising:
      a substrate with a substrate top and a substrate bottom;
      an optoelectronic transducer on the substrate top;
      at least one top electrical component on the substrate top, the top electrical component operably coupled with the optoelectronic transducer; and
      a controller coupled to the substrate bottom, the controller operably coupled with the optoelectronic transducer and configured to send and receive control signals to the at least one top electrical component and optoelectronic transducer; and
   a housing coupled to the header subassembly and defining a cavity at least partially enclosing the optoelectronic transducer and the top electrical component, the controller located outside of the housing.

10. The optoelectronic subassembly of claim 9, wherein the housing hermetically seals the optoelectronic transducer and the top electrical component.

11. The optoelectronic subassembly of claim 9, wherein the controller is electrically coupled with the top electrical component and the optoelectronic transducer.

12. The optoelectronic subassembly of claim 9, wherein the optoelectronic transducer and the top electrical component are electrically coupled by RF lines, and wherein the controller is not coupled by RF lines.

13. The optoelectronic subassembly of claim 9, wherein the substrate is a multilayer substrate.

14. The optoelectronic subassembly of claim 13, further comprising vias extending through at least a portion of the substrate, wherein the at least one of the vias is electrically coupled with at least one signal line positioned on the substrate top.

* * * * *